United States Patent [19]
Jain et al.

[11] Patent Number: 5,710,619
[45] Date of Patent: Jan. 20, 1998

[54] LARGE-AREA, SCAN-AND-REPEAT, PROJECTION PATTERNING SYSTEM WITH UNITARY STAGE AND MAGNIFICATION CONTROL CAPABILITY

[75] Inventors: Kanti Jain, Briarcliff Manor, N.Y.; Jeffrey M. Hoffman, Stamford, Conn.

[73] Assignee: Anvik Corporation, Hawthorne, N.Y.

[21] Appl. No.: 551,134

[22] Filed: Oct. 31, 1995

[51] Int. Cl.$^6$ .................... H01L 21/30; G03B 27/52
[52] U.S. Cl. .................... 355/50; 355/53; 355/55
[58] Field of Search .................... 355/50, 53, 54, 355/55, 60, 72, 75

[56] References Cited

U.S. PATENT DOCUMENTS

| | | | |
|---|---|---|---|
| 5,285,236 | 2/1994 | Jain | 355/53 |
| 5,477,304 | 12/1995 | Nishi | 355/53 |
| 5,625,436 | 4/1997 | Yanagihara et al. | 355/53 |

FOREIGN PATENT DOCUMENTS

| | | | |
|---|---|---|---|
| 6-310399 | 11/1994 | Japan | H01L 21/027 |

*Primary Examiner*—Joan H. Pendegrass
*Attorney, Agent, or Firm*—Carl C. Kling

[57] ABSTRACT

In numerous applications of large-area patterning systems, the preferred image magnification is unity. However, in some applications, the size of the substrate may change slightly due to various thermal and/or chemical processing steps. To compensate for scale changes of the substrate, the magnification of the imaging system must vary slightly from unit magnification (typically by a fraction of a percentage) so that a layer already patterned on the substrate will have, after processing, proper image registration with the subsequent layer.

This disclosure describes a lithography system for exposing large substrates at high imaging resolution and high exposure throughput, and specifically relates to a scan-and-repeat patterning system that employs a unitary mask-substrate stage and enables projection imaging of a substrate with capability to control the image magnification to compensate for changes of substrate dimensions occurring as a result of previous process steps.

A combination of optical and mechanical compensation is used to provide the necessary magnification control, including anamorphic magnification variation in which the fine adjustment is of different magnitudes in x and y dimensions. The optical control is provided by a projection lens with anamorphic magnification adjustment capability. The mechanical compensation is performed by providing a differential relative velocity between the mask and substrate during scanning.

26 Claims, 8 Drawing Sheets

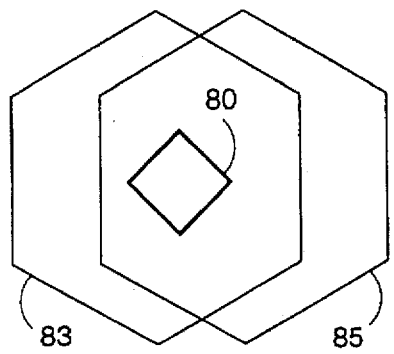
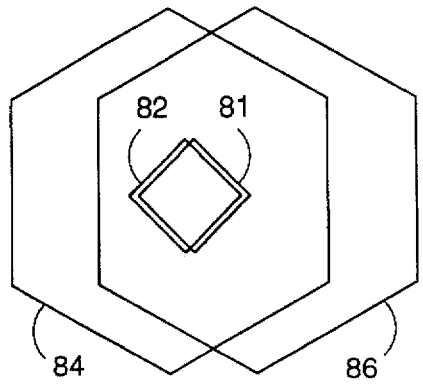
Fig. 5
Fig. 6
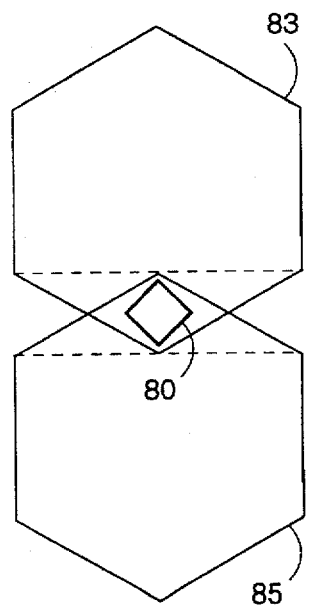
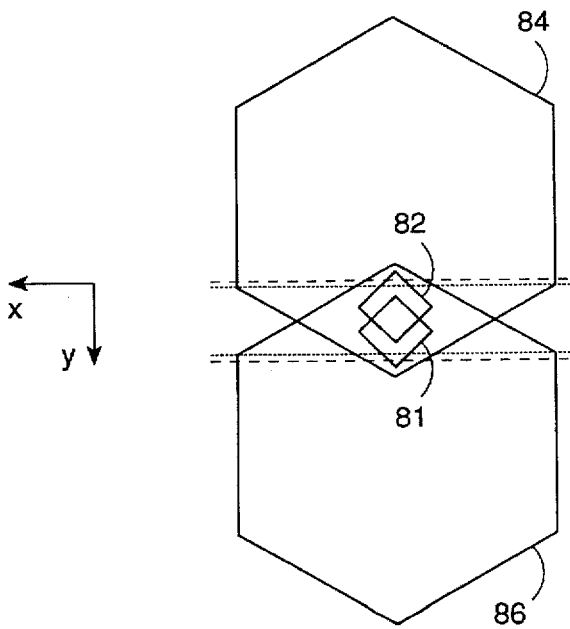
Fig. 7
Fig. 8

LARGE-AREA, SCAN-AND-REPEAT, PROJECTION PATTERNING SYSTEM WITH UNITARY STAGE AND MAGNIFICATION CONTROL CAPABILITY

FIELD OF THE INVENTION

This invention relates to lithography systems for exposing large substrates at high imaging resolution and high exposure throughputs, and specifically relates to a scan-and-repeat patterning system that employs a unitary mask-substrate stage and enables projection imaging of a substrate with capability to control the image magnification to compensate for changes of substrate dimensions occurring as a result of previous process steps.

BACKGROUND OF THE INVENTION

One of the co-inventors of this application has previously disclosed several large-area patterning systems (U.S. Pat. Nos. 4,924,257; 5,285,236 and 5,291,240). In these previous inventions, this co-inventor, K. Jain, has disclosed projection imaging apparatus for manufacturing a variety of products, including integrated circuits on silicon wafers, flat-panel displays on glass substrates, and multi-chip modules and printed circuit boards on laminate substrates. In a co-pending application (Ser. No. 08/506,232), co-inventor Jain has also described a high-throughput projection imaging system for patterning large, flexible, roll-fed substrates. Some of the projection imaging systems described in the cited patents and patent application have an image magnification of unity (i.e., feature sizes at the mask are equal to corresponding feature sizes at the substrate) whereas others are reduction imaging systems in which each mask feature size is a multiple of the corresponding substrate feature size. The 1:1 magnification systems described in the above patents and patent application also incorporate a single scanning stage on which both the mask and the substrate are rigidly mounted. The reduction systems of prior art employ two independent stages—one for holding and scanning the mask and the other for holding and scanning the substrate.

Whereas the single-stage scan-and-repeat systems have the advantages of elegance of system design and lower system cost, a disadvantage is their inability to provide any image magnification control capability, which stems from the fact that the mask and substrate are rigidly mounted on a single stage. On the other hand, a scanning reduction system employing independent mask and substrate stages can provide magnification adjustment capability, but is significantly more costly due to higher system complexity which results from the requirement of synchronizing the scanning motions (at different velocities due to the non-unity image magnification) of two mechanically independent stages.

In numerous applications of large-area patterning systems, the preferred image magnification is 1:1, which makes several of the projection systems described in the cited patents very attractive. However, in some applications, the size of the substrate may change slightly due to various thermal and/or chemical processing steps. To compensate for scale changes of the substrate, the magnification of the imaging system must vary slightly from unit magnification (typically by a fraction of a percentage) so that a layer already patterned on the substrate will have, after processing, proper image registration with the subsequent layer.

Thus, it becomes highly desirable to develop an apparatus that can exploit the design and cost benefits of 1:1 large-area, scan-and-repeat projection imaging, and at the same time, can enable fine adjustment of the image magnification for optimum lithographic performance.

SUMMARY OF THE INVENTION

For lithographic patterning of large-area substrates at high throughput, it is desirable to use a large-format scanning exposure system with unit magnification. In such a system, it is further desirable to have the capability to control the image magnification to compensate for changes of substrate dimensions occurring as a result of previous process steps. The object of this invention is to provide fine adjustment to unit magnification in a large-area, scan-and-repeat projection imaging apparatus.

Another object of the invention is to combine optical correction with mechanical correction to compensate for small dimensional changes of the substrate. The optical system will provide symmetric or anamorphic magnification control, and the scanning stage will employ an auxiliary-stage-on-primary-stage mechanism to provide a dynamic fine differential motion of the substrate relative to the mask during scanning. The combination of optical and mechanical correction will allow for changes in magnification without degradation of the image during scanning.

An advantage of the invention is that it permits subsequent imaging of a previously imaged substrate section by the same imaging apparatus, even though the substrate size parameters may have been changed slightly during the previous processing.

Another advantage of the invention is that it reduces the tolerances on substrate dimensions since the substrates do not need to be an exact dimensional match to each other nor to the mask.

Still another advantage of the invention is that it permits anamorphic variation of magnification, to allow for differing scale changes in the directions parallel and perpendicular to the scanning direction.

Other objects, features and advantages of the invention will be apparent to those skilled in the art from the following description of the invention and the attached drawings.

BRIEF DESCRIPTION OF THE DRAWINGS

FIG. 5 shows how an image of a feature within the non-overlapping portion of the illumination region is properly registered with an image of the same feature a short time later during scanning when the mask and substrate are scanned at the same speed and the magnification is precisely unity.

FIG. 6 shows how the two images described in FIG. 5 will fail to register if the mask and substrate are scanned at the same speed and the magnification deviates slightly from unity.

FIG. 7 shows how an image of a feature within the overlapping portion of the illumination region is properly registered with an image of the same feature produced during an adjacent scan when the mask and substrate are scanned at the same speed and the magnification is precisely unity.

FIG. 8 shows how the two images described in FIG. 7 will fail to register if the mask and substrate are scanned at the same speed and the magnification deviates slightly from unity.

DETAILED DESCRIPTION OF THE EMBODIMENTS

Figure 1:
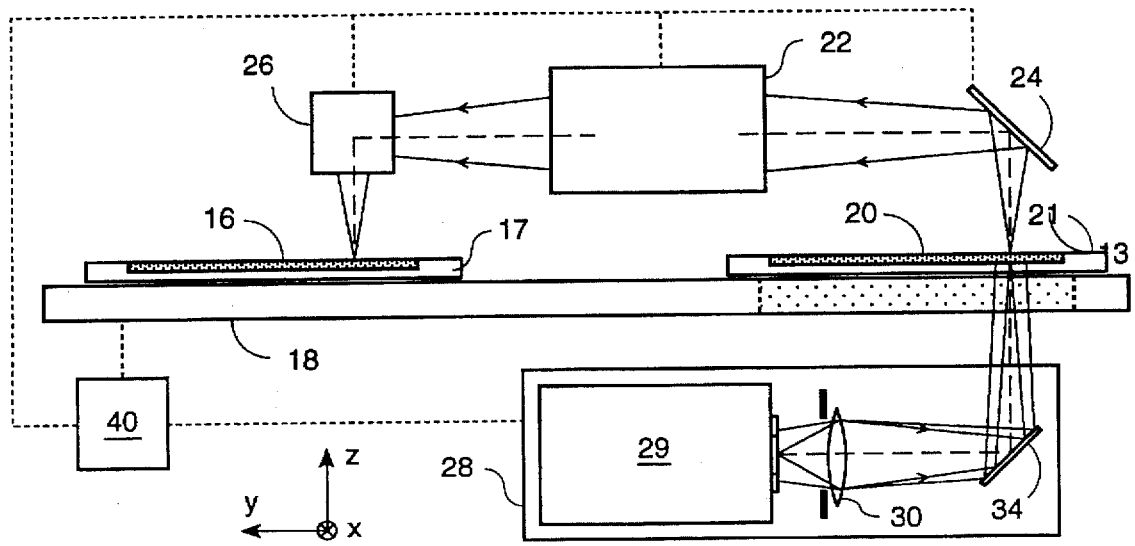
FIG. 1 is a semi-schematic illustration in elevation view of a portion of the new patterning system employing a unitary mask-substrate stage, showing projection imaging of a region on a mask, illuminated from below, onto a corresponding substrate region.
Figure 2:
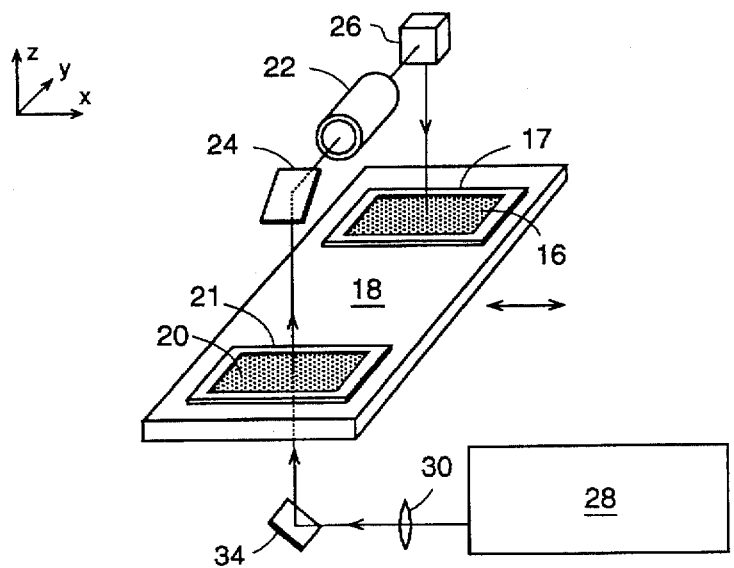
FIG. 2 is a perspective view of the patterning system of FIG. 1.

FIG. 1 presents a simplified schematic of a portion of the new patterning system. A partial perspective is presented in FIG. 2. Substrate 16 is mounted in a substrate holder 17, which is rigidly held on a scanning stage 18. (In an embodiment of the invention for patterning roll-fed substrates, reference character 16 represents one panel-segment of a continuous substrate roll and is held in direct contact with the stage 18 without use of a substrate holder 17; this will be described in detail later.) On the stage 18 is also affixed a mask holder 21 in which is mounted a mask 20. The mask 20 contains the pattern to be produced on the substrate 16. The mask pattern is imaged by a projection lens 22 onto the substrate 16. The optical imaging path also contains a fold mirror 24 and an image reversing unit 26. The projection lens 22 is a refractive lens system, and the reversing unit 26 ensures that the orientation of the image on the substrate is the same as that of the pattern on the mask. The mask 20 is illuminated from below, through an opening 13 in the stage 18, by an illumination system 28. Illumination system 28 typically comprises a light source and additional optical units and components for beam shaping, uniformizing and turning; some of these components have been described in previous patents and are not shown here. The output of the illumination system 28 is delivered to the mask 20 after further processing by lens 30 and mirror 34, leading to uniform illumination of a hexagonal region on the mask.

Figure 3:
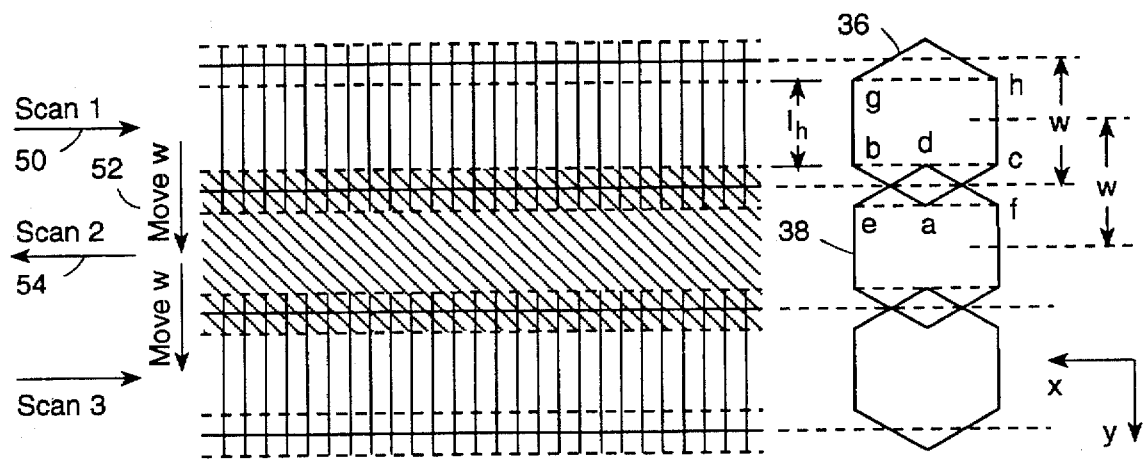
FIG. 3 describes the seamless scan-and-repeat technique, where successive scans of a hexagonal illumination pattern are suitably overlapped to provide a uniform exposure dose over the entire patterning area.

The seamless scanning exposure mechanism has been described in detail in the previous patents cited above, and is summarized here with the illustration of FIG. 3. The single planar stage 18 (FIG. 1) causes the mask 20 and the substrate 16 to scan in unison along the x-axis (i.e., perpendicular to the plane of the paper) across their respective illuminated regions to traverse the length of one panel. The stage then moves along the y-axis by an effective scan width (shown as w, 52, in FIG. 3). Now the substrate and mask are again scanned along x as before, after which they are laterally moved along y, and the process is repeated until the entire panel is exposed. In FIG. 3, the hexagons 36 and 38 represent the illuminated regions on the substrate for scan 1 (50) and scan 2 (54). The y-movement after each x-scan is given by $w=1.5 l_h$, where $l_h$ is the hexagon side-length. In scan 1, the region swept by the rectangular portion b-g-h-c of hexagon 36 is not overlapped by any portion of scan 2. However, the region swept by the triangular segment a-b-c of hexagon 36 in scan 1 is re-swept in scan 2 by the triangular segment d-e-f of hexagon 38. When the doses from these triangular segments are integrated, the cumulative exposure dose anywhere in the overlapping region is the same as in the non-overlapping regions, producing a seamless, uniform exposure over the whole substrate.

Figure 4:
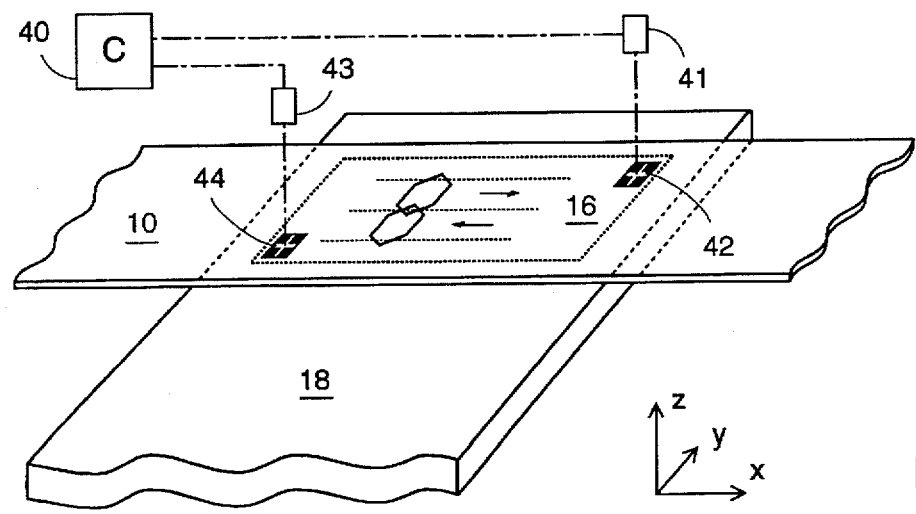
FIG. 4 is a perspective drawing showing two adjacent, overlapping scans of the hexagonal illumination region on a panel-size segment of a continuous, roll-fed, flexible substrate.

When the substrate is made of a flexible material and is fed from a roll, we have, instead of a discrete substrate 16 held in a holder 17 mounted on the stage 18, a panel-size segment 16 of the roll material 10, with the segment 16 being affixed to the stage by vacuum, and the illumination and scanning being as before. This is illustrated in FIG. 4, and has been previously described in the above-cited co-pending application by co-inventor Jain.

In another embodiment, the substrate 16 may comprise multiple segments, each corresponding to a mask with the same dimensions as one substrate segment.

The description above has illustrated how the patterning system concept using hexagonal seamless scanning enables the designer to deliver the desired resolution over very large substrate areas efficiently. Note that in the schematic illustrations of FIGS. 1, 2 and 4, since the mask and the substrate are held on a single scanning stage, the magnification of the projection subsystem must be precisely unity. If the magnification is not exactly 1:1, the image (produced on the substrate by the lens) of a given illuminated region on the mask will not overlap correctly with the image that will be produced when the illuminated region on the mask moves slightly as the stage scans. This is illustrated in FIGS. 5 and 6. Consider a segment 80 on the substrate which is imaged when the full illuminated region on the substrate is region 83. As the stage scans, let region 85 represent the illuminated region on the substrate a short time later. If the magnification of the projection system is precisely unity, the segment 80, when it is a part of region 85, will fall exactly at the same location as when it was a part of region 83. FIG. 6 shows what happens when there is a small departure from a magnification of 1:1. Here, 81 represents the location of the square segment (a slight magnification of 80) when it is a part of region 84 (a slight magnification of 83), and 82 represent the square segment when it is a part of region 86 (a slight magnification of 85). As depicted in FIG. 6, the two square segments fail to overlap exactly, resulting in blurring of the image and thus, loss of resolution. In a similar manner, when adjacent scans are partially overlapped according to FIG. 3, the same non-registration problem will occur in the overlap region between the scans, as illustrated in FIGS. 7 and 8.

Note that, as mentioned before, the situation in which an image magnification slightly different from unity exists, may not necessarily be from an error in the projection system but, rather, a desirable feature that will be attractive to have in order to accommodate any minute size variation the substrate may have undergone in a thermal or chemical processing step prior to the patterning exposure. Better still, the ideal system will provide independent control of the magnification values along the x-axis and the y-axis. Typically, the desired magnification adjustment is significantly smaller than 1%.

In order to provide correspondence between the size parameters of a mask feature and a substrate feature despite small discrepancies of mask-substrate congruence caused by previous processing, an embodiment of the invention provides that the substrate be equipped with means 41 and 43 to find and monitor registration marks 42 and 44 on substrate 16 as shown in FIG. 4. The control means 40 for the projection imaging system works with the means 41 and 43 to monitor the registration marks 42 and 44, to provide dynamic control of the optical magnification adjustment means and the auxiliary stage subsystem.

The objective of this invention is to make it possible for a scanning projection system employing a unitary stage to provide magnification adjustment control and, simultaneously, prevent the image non-registration shown in FIGS. 6 and 8. We now describe how the invention accomplishes this objective.

In the first embodiment, we describe how magnification control can be provided along the x-axis, i.e., the direction of the scan. Let the scanning velocity of the stage in the x-direction during exposure be $v_x$. Since the mask is held rigidly on the stage, the mask also moves with a velocity $v_m = v_x$. In the prior art cited above, the substrate is also held rigidly on the stage and therefore, its scanning velocity $v_s$ is the same as that of the mask, i.e., $v_s = v_x$. Normally, the magnification, M, of the projection lens is assumed to be unity (M=1), and therefore, it is acceptable to have the scanning velocities of the substrate and the mask be equal, i.e., $v_s = v_m$.

However, if M departs from unity, as represented by M=1+δ, where δ<0.01, then the substrate and mask velocities being the same would cause image blurring as described in the paragraphs above and illustrated in FIGS. 5–8. The solution provided in the present invention is to enable a velocity differential between the mask and the substrate in the same proportion as the image magnification ratio. If the magnification is M=1+δ, we provide capability for the substrate holder to move on the stage by a small amount at a low velocity such that its effective velocity relative to the projection lens may be given by, $$v_s = (1+\delta)v_m.$$

In essence, we provide means for the substrate holder 17 to move with respect to the stage 18 at a velocity $\delta v_m$, which adds to the stage velocity $v_m$, giving a net substrate velocity of $(1+\delta)v_m$, which enables the substrate to compensate for the image shift caused by the magnification deviation of δ, and thus prevents the image blurring.

Mechanical Velocity and Scan Width Control

Figure 9:
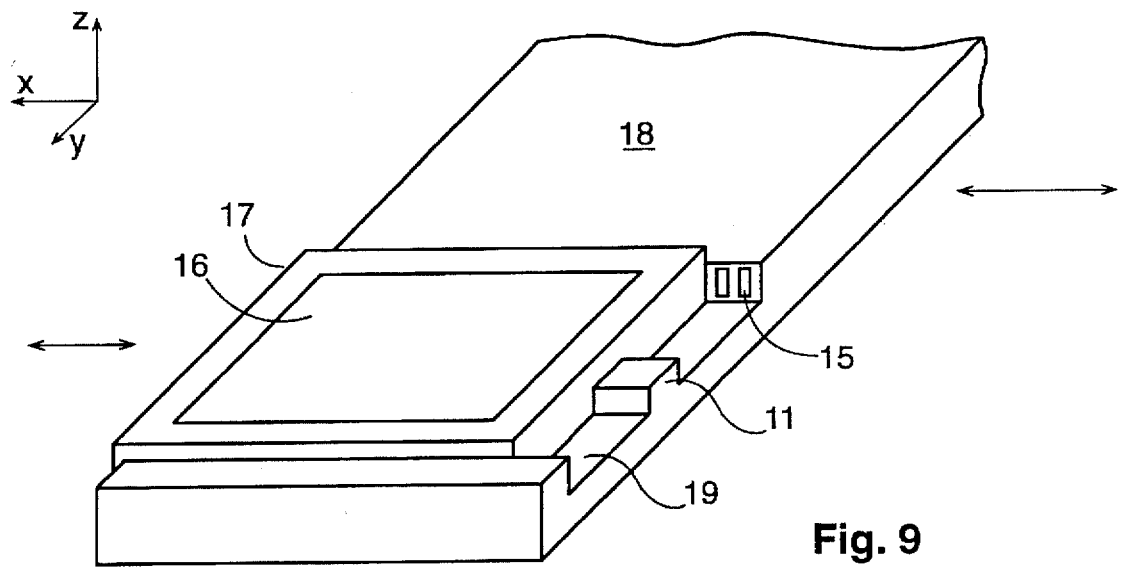
FIG. 9 illustrates an embodiment of the patterning system with an auxiliary stage mounted to the primary mask-substrate stage using a linear motor for moving the substrate relative to the mask in one direction.

We now describe several ways of providing the above incremental velocity adjustment to the substrate. FIG. 9 depicts an embodiment in which the substrate holder 17 is situated in a slide 19 with a rail 11 in which the substrate holder is able to slide along the x-direction. The slide 19 is built into the stage 18. The drive for the slide 19 can be a linear motor, e.g., 15, or it can be some suitable mechanical means, as described later. Note that the total travel range for the substrate holder needed within the slide 19 is extremely small. For example, assuming a representative substrate size of 300×300 mm, a 1% magnification adjustment would require a maximum travel of 300×0.01=3 mm for the substrate holder. Similarly, the velocity at which the substrate holder needs to move within the slide is also very low. For example, assuming a typical mask scanning velocity of $v_m$=250 mm/sec, a deviation of 1% in the magnification would require that the substrate holder 17 move within the slide 19 at a speed of $\delta v_m$=250×0.01=2.5 mm/sec. We remark that the direction of the movement of the substrate holder within the slide will alternate between the +x and −x directions as the scanning direction of the stage 18 alternates between the +x and −x directions. In practice, to determine δ, the substrate size is measured after each process step and compared to the mask size. Knowing δ, the slide motor 15 is then programmed to move the substrate holder 17 at a velocity of $\delta v_m$.

Figure 10:
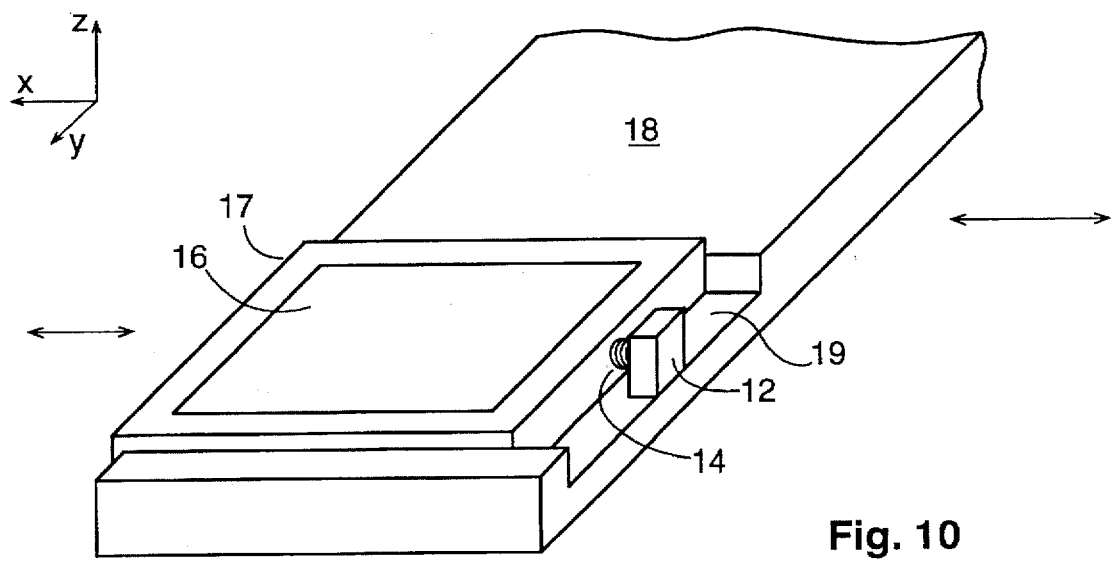
FIG. 10 illustrates an embodiment of the patterning system with an auxiliary stage mounted to the primary mask-substrate stage using a lead screw motor for moving the substrate relative to the mask in one direction.

An embodiment employing a different drive means is shown in FIG. 10. Here, the incremental motion of the substrate holder 17 in the slide 19 is provided by a lead screw 14 which is driven by a motor 12. We emphasize that in the embodiments of both FIGS. 9 and 10, the control signals that drive the motors 15 or 12 are provided by a central system control unit that ensures proper movements of all stages and operation of the illumination source.

In the descriptions of FIG. 9 and 10, we have realized magnification control along the x-axis by providing motion capability for the substrate. Alternatively, and in an identical fashion, the motion capability can be implemented for the mask instead of for the substrate, with similar effective result. In fact, making the mask movable in a slide may be somewhat preferable to making the substrate movable; this is so because the overall patterning system may include a high-speed, automated substrate loader which may require the substrate side of the stage 18 to frequently move in and out of the loader, which may make it desirable to make the substrate side of the stage light-weight and comprising few or no moving parts.

Figure 11:
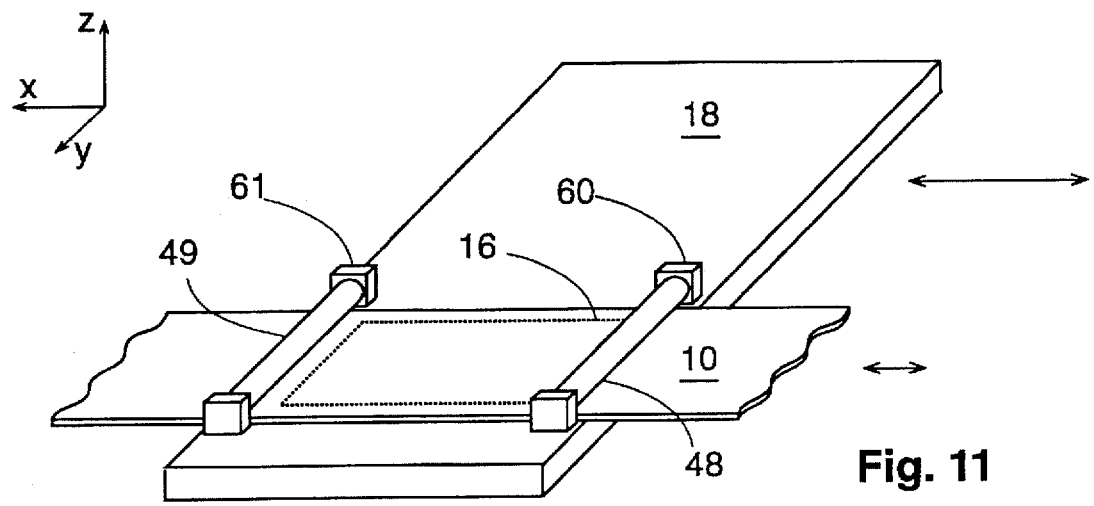
FIG. 11 is a perspective view showing a set of platens mounted to the primary mask-substrate stage for feeding a continuous, flexible substrate onto the primary stage and moving the substrate relative to the mask in one direction.
Figure 12:
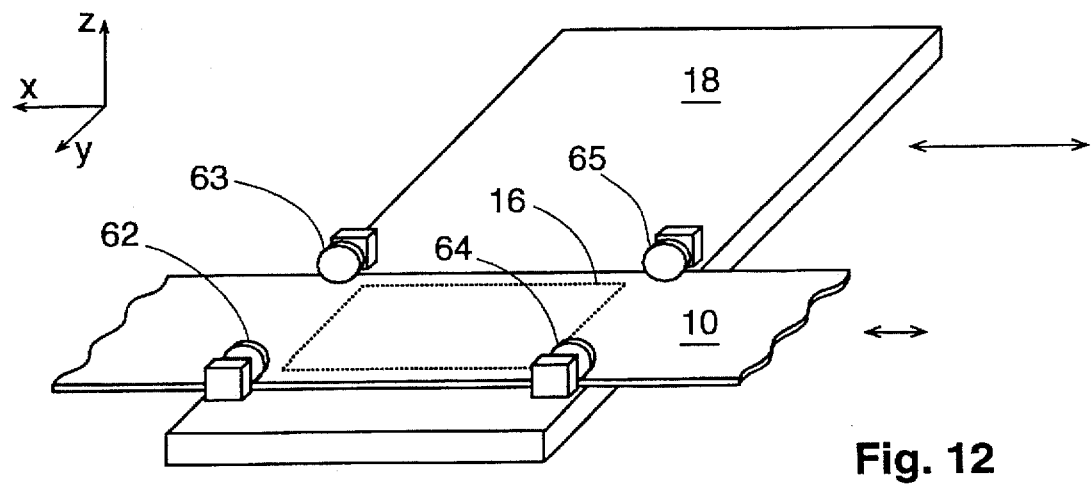
FIG. 12 is a perspective view showing a set of edge rollers mounted to the primary mask-substrate stage for feeding a continuous, flexible substrate onto the primary stage and moving the substrate relative to the mask in one direction without contacting the substrate within the patterning area.

When the patterning system is designed for exposing flexible substrates, the adjustment of x-magnification is provided as shown in FIG. 11. Here, the flexible substrate 10 is held against the top surface of the stage 18 by platens 48 and 49. The platens are made with a suitable rubber-like surface that provide adequate friction so that by turning the platens, the substrate 10 can be moved along x. The platens are driven by motors 60 and 61. By providing appropriate control signals to these motors, the substrate can be moved at the required velocity in the x-direction to realize the desired net substrate velocity, and thereby the desired magnification. The platens shown in FIG. 11 make contact with the substrate along their entire length. As an alternative, when such contact is undesirable, the platens can be replaced with edge rollers (62–65), as shown in FIG. 12. At least one pair of the edge rollers in FIG. 12 are motor-driven, similar to platen motors 60 and 61.

If the substrate comprises multiple segments that are patterned using a single mask with the dimensions of one segment, the technique for providing magnification control is identical to that using a single substrate, except that the stage system must be capable of also moving the mask to a suitable location for patterning a selected segment of the substrate.

We also point out that whenever a magnification adjustment is made in the y-direction, the effective scan width w (FIG. 3) at the substrate must be adjusted accordingly so as to provide the proper partial overlap between adjacent scans as described earlier in this disclosure and as illustrated in FIG. 3. Because the effective scan width at the substrate will be different from the effective scan width at the mask when the magnification perpendicular to the scan direction deviates from unity, a relative movement between mask and substrate perpendicular to the scan direction must be performed as well. This is accomplished as described below.

To provide differential motion of the mask relative to the substrate both parallel to the scan direction (during scanning) and perpendicular to the scan direction (when stepping between scans) we use two auxiliary stages mounted to the primary stage to move either the mask or substrate. In the preferred embodiment, we use an auxiliary stage to give a relative motion between mask and substrate in one direction at the mask and an auxiliary stage to give a relative motion between mask and substrate in the orthogonal direction at the substrate. This method would be particularly useful if the relative motion in one direction is produced using platens or edge rollers for moving a roll-fed substrate. The complexity of the stage for adjusting the step width may be lower than the complexity of the auxiliary stage for adjusting the relative velocity during scanning since the movement is not made while imaging.

Optical Magnification Control

We next describe optical means to provide adjustment and control of the image magnification. One technique is to adjust the separation between certain elements or groups of elements in the projection lens assembly. By free adjustments of the spacings of the individual lens elements, the magnification of the projection lens assembly can be varied as desired in a small range around its nominal value of unity.

Figure 13:
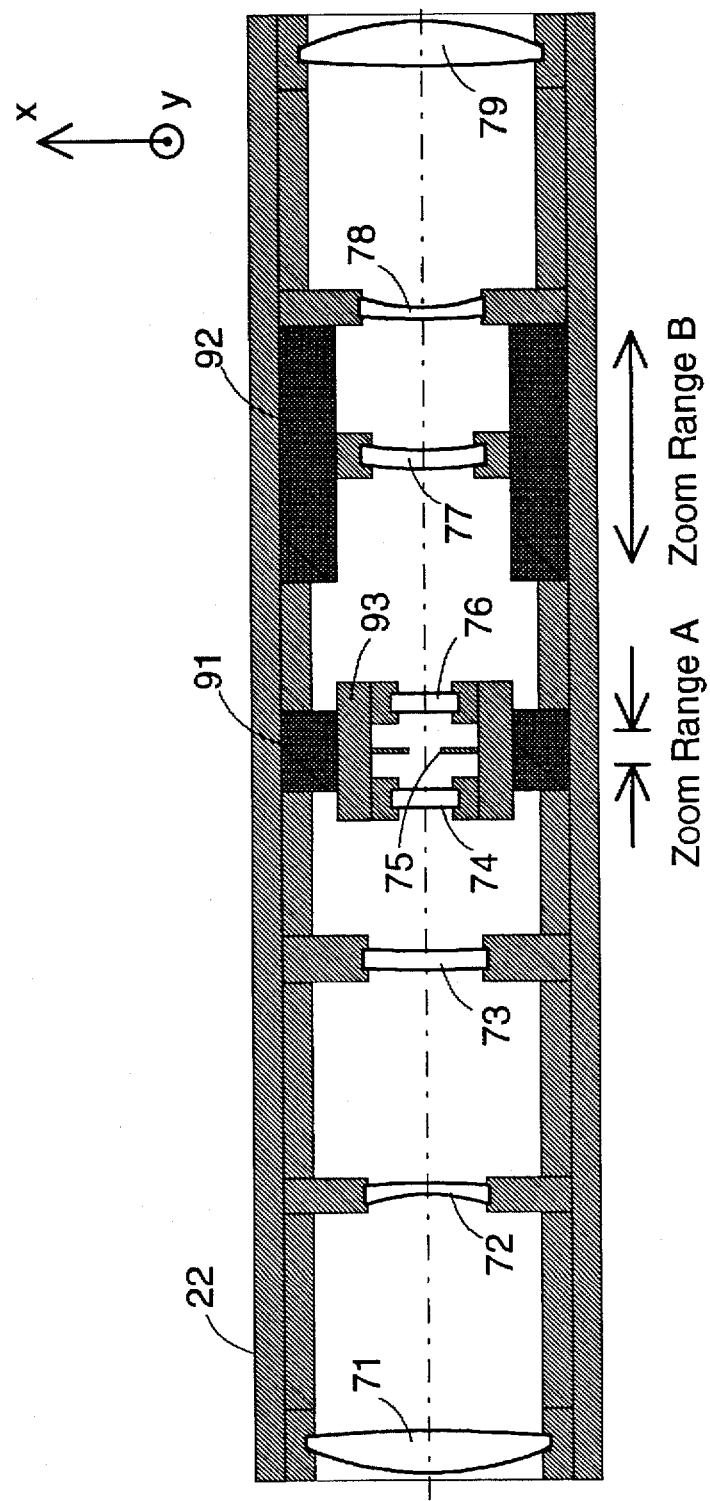
FIG. 13 illustrates an embodiment of a multi-element projection lens with zooming elements for symmetric and anamorphic magnification control in a small range around unit magnification.

FIG. 13 illustrates an example of how the magnification control may be accomplished. A projection lens assembly 22 is made up several lens elements; the embodiment shown in FIG. 13 has six elements 71, 72, 74, 76, 78, and 79 with spherical, rotationally symmetric surfaces, and two elements 73 and 77 with cylindrical surfaces. The aperture stop 75 is located at the center of the lens, and the lens is roughly symmetric about the aperture stop 75. In FIG. 13, the local x- and y-axes for the projection lens correspond to the x- and y-axes of the illuminated region on the substrate 16 shown in FIG. 1 such that a change in the x- and y-magnification of the projection lens will produce a corresponding change in x- and y-magnification of the image at the substrate. In this example, the lens has been designed nominally for imaging at unit magnification with resolution of 10 μm using a 308 nm xenon chloride excimer laser source. Other parameters include a 50 mm field of view, a numerical aperture of 0.0154, and a total track length from object to image plane of roughly one meter.

Most of the power and aberration correction is produced by the outer lens elements 71, 72, 78, and 79, which are symmetric about the aperture stop 75. To vary the magnification symmetrically, two central lens elements 74 and 76 may be moved relative to the rest of the lens assembly. The magnification adjustment will be equal in the x- and y-directions since the effect of adjusting the positions of lens elements 74 and 76 is axially symmetrical around the optical axis of the lens assembly. In this embodiment, these elements are weakly positive (long positive focal lengths) and may be moved in unison to provide a variation of magnification (identical in x- and y-directions) over the range of −0.990 to −1.010 (±1%) without significant degradation of imagery (negative magnification indicates that the lens inverts the image). The magnification change is linear over this range as a function of the displacement of the components along the optical axis.

Since lens elements 74 and 76 are moved in unison over the entire range of magnification, they may be mounted into a common fixture. In FIG. 13, the lens elements 74 and 76 and the aperture stop 75 are mounted in a common barrel 93 which may be moved by a single drive motor 91 over Zoom Range A. Since Zoom Range A is small, it may be acceptable to move the aperture stop along with lens elements 74 and 76. Alternatively, barrel 93 may be designed with slots to allow the aperture stop 75 to be held at a fixed position with respect to the main lens barrel 22 by spokes that will not inhibit the motion of the inner barrel 93.

Figure 14:
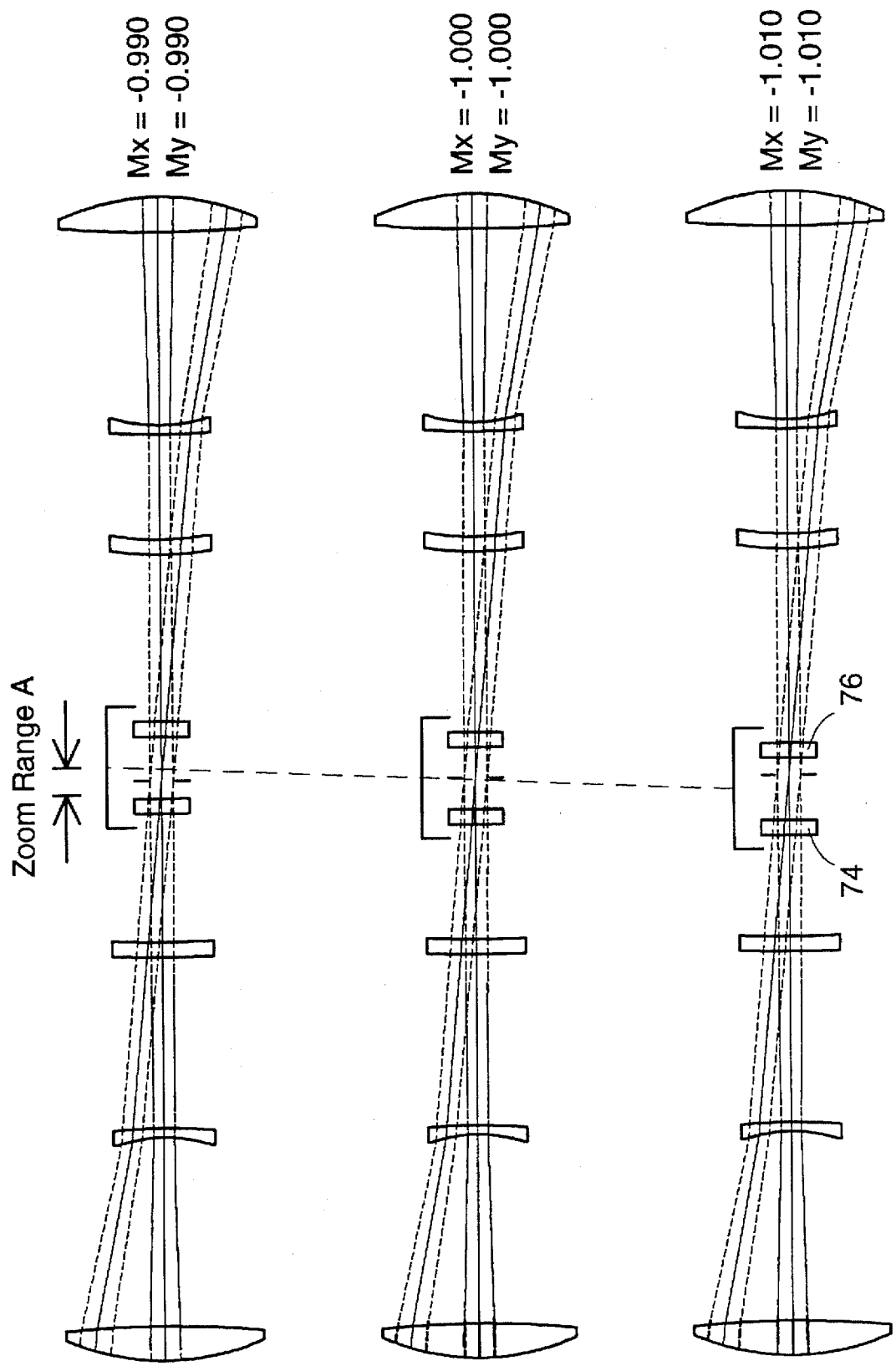
FIG. 14 illustrates a mechanism for varying the magnification symmetrically in the embodiment shown in FIG. 13 by a linear translation of two weak spherical central elements.

FIG. 14 shows the variation in the axial position (Zoom Range A) of elements 74 and 76 for a range of magnification of +1%. At unit magnification, these elements are symmetric about the aperture stop.

Figure 15:
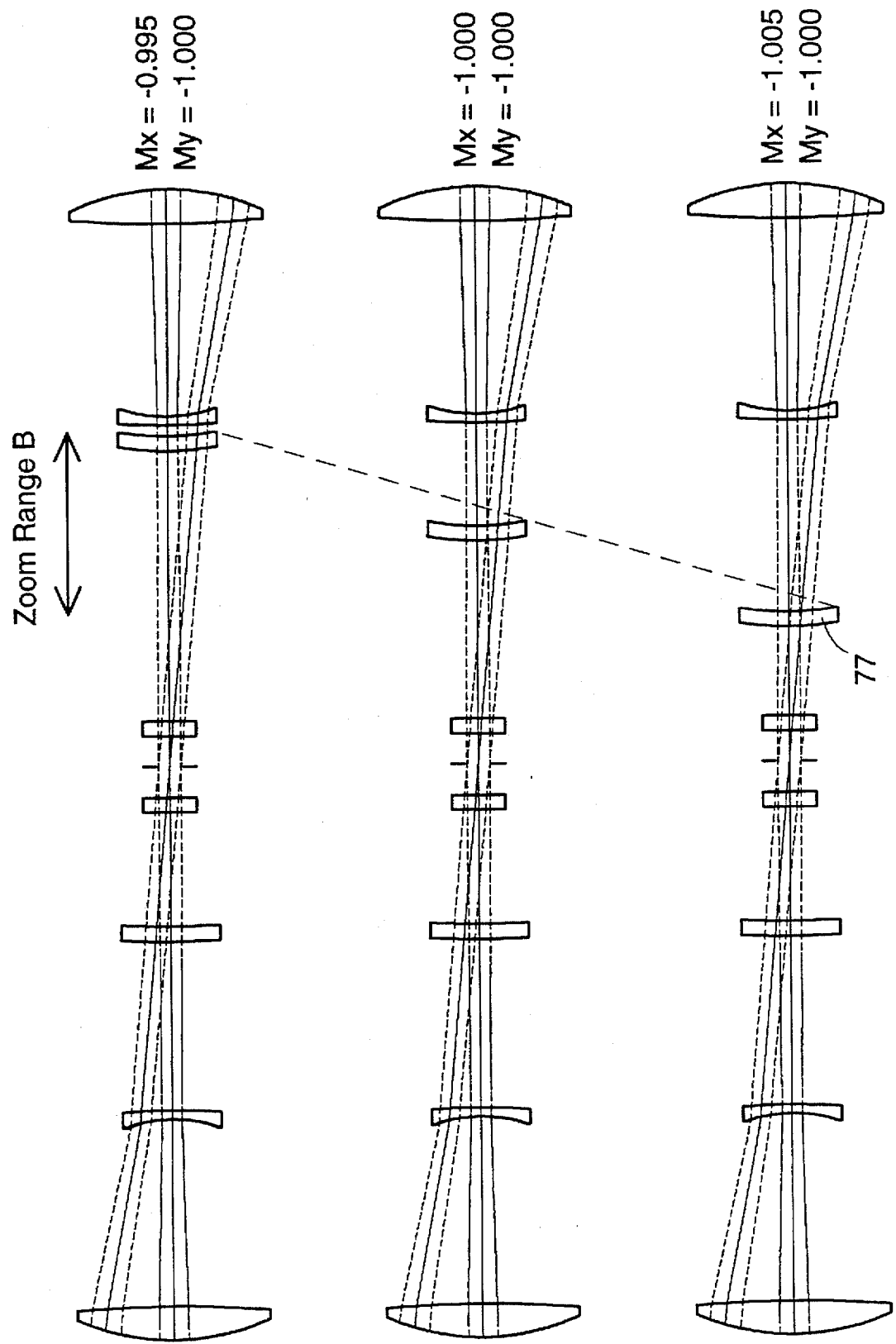
FIG. 15 illustrates a mechanism for varying the magnification in one direction only in the embodiment shown in FIG. 13 by a linear translation of a weak cylindrical central element.

To vary the magnification in the x-direction only (or alternatively, in the y-direction), two cylindrical elements 73 and 77 are used, as shown in FIG. 13, and dement 77 is moved relative to the rest of the lens assembly by drive motor 92. Element 73 is cylindrical such that it has no curvature in the y-direction and is very weakly negative in the x-direction. Inner element 77 is cylindrical such that it has no curvature in the y-direction and is very weakly positive in the x-direction. The focal length of dement 73 is approximately equal and opposite in sign to that of dement 77. Here, a magnification variation over the range of ±0.5% may be achieved. The magnification varies linearly as a function of the axial displacement of dement 77. FIG. 15 shows the movements of dement 77 (over Zoom Range B) that give a magnification variation of ±0.5%.

The symmetric magnification variation resulting from movement of elements 74 and 76 may be added to the variation of magnification in the x-direction produced by moving element 77. Thus, this example will provide anamorphic magnification variation with a range of magnification variation in the y-direction of up to ±1% and additional variation in the x-direction of up to ±0.5%, without degrading the performance of the lens.

The lens in this example was designed to show the feasibility of providing anamorphic magnification variation with a high-resolution lithographic lens. For a given application, the specifications of the lens, including resolution, numerical aperture, optimal wavelength, total track, and required range of magnification would depend upon the requirements of the particular application.

There are many possible arrangements of the projection lens that would allow for the required anamorphic magnification variation. The goal of the optimum design is to minimize the number of elements and complexity of the required motion control. Other variations of the above embodiment are possible. For example, the cylindrical elements for magnification control in one direction only may be placed inside the elements moved for symmetric magnification control with similar results. The same results may also be obtained by moving element 73 rather than 77 for magnification control in only one direction. Motion of both elements 73 and 77 relative to the rest of the lens may be used to provide the magnification control, which may be beneficial if the required magnification range is very large or the range of travel needs to be reduced. Motion of both cylindrical elements will generally be more complex than motion of one element only.

Another possible design choice would have two cylindrical elements for magnification control in the x-direction and two cylindrical elements for magnification control in the y-direction, which would allow for completely independent control of magnification in the two dimensions.

The example illustrated in FIGS. 13–15 keeps the overall length of the projection lens and the object and image distances constant as some of the individual lens elements are zoomed. If keeping the overall length of the projection lens is not a constraint, then motion of the outer elements relative to the center of the lens may also be used; this may have the benefit of reducing the number of elements required or increasing the range of magnification control.

If the specific design requires that the zooming lens elements be moved independently, separate drive motors for each lens element may be used. Another common method is to support the moving lens elements in cells on guide rods; the cells are then driven by balls or cam follower pins running in slots in a cylindrical cam.

Dynamic control of the optical magnification adjustment means is provided by the control means 40 for the projection imaging system. When the substrate 16 is equipped with registration marks 42 and 44, the control means 40 works with monitoring means 41 and 43 to monitor the registration marks so as to provide corresponding size parameters of a mask feature and substrate feature, even when there are small discrepancies of mask-substrate congruence caused by previous processing.

With the combination of mechanical control of the scan velocity and step width (FIGS. 9–12) and optical control of the image magnification (FIGS. 13–15), the required variations in magnification can be provided while allowing the mask and substrate to be scanned together on a common stage. Furthermore, any required values of magnification adjustment can be provided independently along the x- and y-directions to compensate for different scale changes of the substrate as a result of various process steps.

We claim:

1. A large-area, high-throughput, high-resolution, scan-and-repeat, projection imaging system for replicating a pattern on a mask onto a corresponding pattern area segment of a substrate having a set of one or more segments, said system including a projection lens of a known characteristic magnification of substantially unity, characterized by:

(a) a primary stage subsystem (18), having mask holding means (21) and substrate holding means (17), capable of scanning in one dimension, and also being capable of moving laterally in a direction perpendicular to the scan direction so as to position itself for another scan; said primary stage subsystem (18) thus being capable of exposing each full substrate segment by configuring each substrate segment into a certain number of parallel strips, and exposing each of said strips by scanning the length of the strip across a fixed illumination region;

(b) an illumination subsystem (28) having spectral and intensity characteristics suited for exposure of said substrate (16), having an effective source plane of a predetermined shape, and capable of uniformly illuminating on said mask (20) a region of said predetermined shape;

(c) a projection subsystem (22–26) capable of imaging said illuminated region on the mask onto a selected substrate segment, and having an image field area smaller than the substrate segment area;

(d) optical magnification adjustment means (74,76–77, 91–93) for variation of the image magnification of said projection subsystem across a small range of values close to unit magnification;

(e) differential motion means (17/21/48,49,60,61/62–65) mounted to primary stage subsystem (18) for providing limited relative motion between said mask (20) and said substrate segment (16); and (f) control means to operatively interrelate said stage subsystem (18), said illumination subsystem (28), said projection subsystem (22–26), said optical magnification adjustment means (74,76–77,91–93), and said differential motion means (17/21/48,49,60,61/62–65) to provide additive illumination and image placement in certain overlap regions of areas exposed by adjacent strip scans of each substrate segment such that the effect of the exposure dose delivered in said overlap regions is seamless and the effect of the exposure dose delivered across each entire substrate segment is uniform.

2. A projection imaging system according to claim 1, further characterized in that said illumination subsystem (28) has an effective source plane in the shape of a regular hexagon.

3. A projection imaging system according to claim 1, further characterized in that said illumination subsystem (28) provides radiation from a mercury lamp.

4. A projection imaging system according to claim 1, further characterized in that said illumination subsystem (28) provides radiation from a excimer laser.

5. A projection imaging system according to claim 1, further characterized in that said optical magnification adjustment means comprises a multi-element zoom lens (22/77–79,91–93), in which magnification variation is produced by moving one or more lens elements.

6. A projection imaging system according to claim 5, in which said optical magnification adjustment means provides an axially symmetric variation in image magnification.

7. A projection imaging system according to claim 5, in which said optical magnification adjustment means provides a variation in image magnification in one dimension only.

8. A projection imaging system according to claim 5, in which said optical magnification adjustment means provides anamorphic variation in image magnification.

9. A projection imaging system according to claim 5, in which the magnification variation is provided by moving individual lens elements.

10. A projection imaging system according to claim 5, in which the magnification variation is provided by moving groups of lens elements.

11. A projection imaging system according to claim 1, in which said differential motion means comprises an auxiliary translation stage (17/21), mounted to the primary stage subsystem (18), that provides a small relative velocity between the mask and substrate during scanning to compensate for magnification changes along the direction of scan provided by said projection lens (22).

12. A projection imaging system according to claim 11, in which said auxiliary translation stage (21) provides a small motion of the mask (20) relative to the substrate (16) and primary stage subsystem (18).

13. A projection imaging system according to claim 11, in which said auxiliary translation stage (17) provides a small motion of the substrate (16) relative to the mask (20) and primary stage subsystem (18).

14. A projection imaging system according to claim 11, in which said auxiliary translation stage (17/21) slides on roller bearings.

15. A projection imaging system according to claim 11, in which said auxiliary translation stage (17/21) slides on an air bearing.

16. A projection imaging system according to claim 11, in which said auxiliary translation stage (17/21) is driven by one or more linear motors (15).

17. A projection imaging system according to claim 1, in which said differential motion means (17/21) comprises a set of platens (48–49) with motors (60–61), mounted to the primary stage subsystem (18), that provides a small relative velocity between the mask and substrate during scanning to compensate for magnification changes along the direction of scan provided by said projection lens (22).

18. A projection imaging system according to claim 1, in which said differential motion means (17/21) comprises a set of motor-driven edge rollers (62–65), mounted to the primary stage subsystem (18), that provides a small relative velocity between the mask and substrate during scanning to compensate for magnification changes along the direction of scan provided by said projection lens (22).

19. A projection imaging system according to claim 1, in which said control means that operatively interrelates said stage subsystem (18), said illumination subsystem (28), said projection subsystem (22–26), said optical magnification adjustment means (74,76–77,91–93), and said differential motion means (17/21/48,49,60,61/62–65) provides a transverse displacement between adjacent scans of such measure that compensates for the magnification change provided by the projection lens in a direction perpendicular to the scan direction so as to cause precise registration of image placement in the overlap region between adjacent scans.

20. A projection imaging system according to claim 19, in which said differential motion means (17/21) comprises an auxiliary translation stage (17/21) mounted to the primary stage subsystem (18) that provides a small transverse relative motion between mask and substrate perpendicular to the direction of scan when stepping between scans to compensate for magnification changes perpendicular to the direction of scan provided by said projection lens (22).

21. A projection imaging system according to claim 20, in which said differential motion means (17/21) comprises a set of platens (48–49) with motors (60–61) mounted to the primary stage subsystem (18) that provides a small transverse relative motion between mask and substrate perpendicular to the direction of scan when stepping between scans to compensate for magnification changes perpendicular to the direction of scan provided by said projection lens (22).

22. A projection imaging system according to claim 20, in which said differential motion means (17/21) comprises a set of motor-driven edge rollers (62–65) mounted to the primary stage subsystem (18) that provides a small transverse relative motion between mask and substrate perpendicular to the direction of scan when stepping between scans to compensate for magnification changes perpendicular to the direction of scan provided by said projection lens (22).

23. A projection imaging system according to claim 1, further characterized in that said substrate is equipped with registration marks and said control means includes means to monitor said registration marks and provide dynamic control of said optical magnification adjustment means and said auxiliary stage subsystem (17/21) so as to provide matching size parameters of mask feature and substrate feature despite small discrepancies of mask-substrate congruence caused by previous processing.

24. A projection imaging system according to claim 1, further characterized in that said substrate (16) comprises multiple segments each corresponding to said mask (20), in which differential relative motion between the mask (20) and the selected individual substrate segment (16) is provided during scanning of the mask and substrate segment, so as to re-establish the image feature alignment relationship between the mask (20) and the selected individual substrate segment (16), and in which subsequent access to a different selected substrate segment is provided.

25. A projection imaging system according to claim 1, further characterized in that said substrate (16) comprises a segment of a continuous, roll-fed, flexible substrate, corresponding to said mask (20), in which differential relative motion between mask (20) and substrate segment (16) is provided during scanning of the mask and the substrate segment, so as to re-establish the image feature alignment relationship between the mask and the substrate segment, and in which subsequent access to a different substrate segment is provided.

26. A projection imaging system according to claim 1, wherein said projection subsystem with said optical magnification adjustment means has a variable magnification within the range ±1.01:1.00.

* * * * *